US012589690B2

(12) United States Patent
De-Lamberterie et al.

(10) Patent No.: US 12,589,690 B2
(45) Date of Patent: Mar. 31, 2026

(54) LIGHTING DEVICE FOR A MOTOR VEHICLE, COMPRISING AN ILLUMINATED SCREEN

(71) Applicant: VALEO VISION, Bobigny (FR)

(72) Inventors: Antoine De-Lamberterie, Bobigny (FR); Samuel Daroussin, Bobigny (FR); Alexandre Val, Bobigny (FR); Zdravko Zojceski, Bobigny (FR)

(73) Assignee: VALEO VISION, Bobigny Cedex (FR)

( * ) Notice: Subject to any disclaimer, the term of this patent is extended or adjusted under 35 U.S.C. 154(b) by 152 days.

(21) Appl. No.: 18/553,883

(22) PCT Filed: Apr. 5, 2022

(86) PCT No.: PCT/EP2022/059029
    § 371 (c)(1),
    (2) Date: Oct. 4, 2023

(87) PCT Pub. No.: WO2022/214497
    PCT Pub. Date: Oct. 13, 2022

(65) Prior Publication Data
    US 2024/0181960 A1      Jun. 6, 2024

(30) Foreign Application Priority Data
    Apr. 6, 2021    (FR) ...................................... 2103484

(51) Int. Cl.
    *H05K 3/28*        (2006.01)
    *B60Q 1/50*        (2006.01)
    *B60Q 1/32*        (2006.01)
(52) U.S. Cl.
    CPC ............ *B60Q 1/5035* (2022.05); *H05K 3/28* (2013.01); *B60Q 1/324* (2022.05); *B60Q 1/545* (2022.05);
                                        (Continued)

(58) Field of Classification Search
    CPC ...... B60Q 1/5035; B60Q 1/324; B60Q 1/545; H05K 3/28; H05K 2201/10106; H05K 2201/2054
    See application file for complete search history.

(56) References Cited

U.S. PATENT DOCUMENTS

| | | | |
|---|---|---|---|
| 2014/0264417 A1 | 9/2014 | Kobayashi et al. | |
| 2015/0146131 A1* | 5/2015 | Satoh ...................... | G02F 1/172 349/123 |
| 2019/0182951 A1 | 6/2019 | Ellinger et al. | |

FOREIGN PATENT DOCUMENTS

| | | | |
|---|---|---|---|
| KR | 10-2014-0079932 A | 6/2014 | |
| WO | WO-2014030313 A1 * | 2/2014 ............... | F21K 9/27 |

OTHER PUBLICATIONS

International Search Report mailed on Aug. 30, 2022 in PCT/EP2022/059029 filed on Apr. 5, 2022 (2 pages).

* cited by examiner

*Primary Examiner* — Robert J Michaud
(74) *Attorney, Agent, or Firm* — Oblon, McClelland, Maier & Neustadt, L.L.P.

(57)        ABSTRACT

A lighting device for a motor vehicle, including an illuminated screen having a plurality of light sources arranged in a matrix on a substrate having a plurality of electrical interconnecting tracks that extend between the light sources. The substrate includes a first protective layer which is disposed between the light sources and has a first albedo, and a second protective layer which is disposed between the light sources and has a second albedo that is greater than the first albedo, the second layer defining a logo.

20 Claims, 3 Drawing Sheets

(52) U.S. Cl.
CPC .............. *H05K 2201/10106* (2013.01); *H05K 2201/2054* (2013.01)

LIGHTING DEVICE FOR A MOTOR VEHICLE, COMPRISING AN ILLUMINATED SCREEN

The invention relates to the field of motor-vehicle lighting and/or signaling lights. More precisely, the invention relates to the field of screens integrated into light-emitting modules for motor-vehicle lighting or signaling lights.

It is known to integrate screens into light-emitting motor-vehicle devices, into rear lights for example. These screens are for example produced by means of matrix arrays of a high number of selectively activatable light sources, the dimensions of which are small enough for it to be possible to display on these screens information, for example taking the form of messages or pictograms, with a satisfactory resolution. Such information thus allows the motor vehicle to signal better, for example by providing context or by accompanying a given signaling function with a message.

However, this type of screen has two drawbacks.

On the one hand, when these screens are turned off, they form a black zone in the light-emitting device, the appearance of which contrasts with the rest of the light-emitting device and may thus be considered unsightly.

On the other hand, there is a need for a logo to be able to be displayed on the light-emitting device, even when the vehicle is turned off. This need arises, for example, when the manufacturer of a motor vehicle wishes its trademark to be visible on the light-emitting device. Although a light-emitting screen provides an opportunity to display this logo, information or pictogram when the vehicle is running, it is not conceivable to continue supplying power thereto to perpetuate the display when the vehicle is turned off, insofar as the power required to do so would be far too great given the storage capacities of current vehicle batteries. In addition to this aspect, such a functionality would be undesirable from an ecological point of view.

There is thus a need for a light-emitting device for a motor vehicle incorporating a light-emitting screen, the appearance of which turned-off allows a logo to be displayed.

The present invention falls within this context, and aims to meet this need.

To this end, the subject of the invention is a light-emitting device for a motor vehicle, comprising a light-emitting screen including a plurality of light sources arranged in a matrix array on a substrate that is provided with a plurality of interconnecting electrical tracks extending between the light sources, the substrate comprising a first protective layer placed on tracks between the light sources and having a first albedo and a second protective layer placed on other tracks between the light sources and having a second albedo higher than the first albedo, the second layer defining a logo.

The tracks may be tracks on the surface of the substrate or tracks buried in the substrate. Advantageously, preferably when the tracks are on the surface of the substrate, the first protective layer is placed on tracks between the light sources and the second layer is placed on other tracks between the light sources.

In the invention, the term "albedo" is understood to mean the reflective power of a surface (also called its reflectance) expressed in the form of a percentage reflecting the ratio between the light flux reflected from an incident light flux, and this incident light flux. In the remainder of the description, the term "albedo" will be understood to mean diffuse albedo or diffuse reflectance (as opposed to specular albedo or reflectance). In the invention, the term "logo" is understood to mean any shape recognizable by an observer as such, and in particular a shape consisting of one of the following elements or of a combination of a plurality of the following elements: a geometric figure, an alphanumeric character, a pattern, a pictorial representation of a living being.

The invention takes advantage of the fact that most of the visible area of a light-emitting screen is formed not by the light sources but by the substrate of these light sources. This substrate is usually provided with a protective layer, of low albedo, which extends between the light sources, and thus contributes substantially to the black turned-off appearance of the screen. By virtue of the invention, one portion of this first protective layer is replaced by a second protective layer that has a higher albedo, and that is therefore capable of scattering ambient light (such as a light beam emitted by urban lighting or another vehicle) incident on the light-emitting screen to a greater extent than the first layer. It will thus be understood that it is possible to form, using this second protective layer, a logo on the light-emitting screen, both night and day, without it being necessary to supply power to the screen. It will be noted that it is possible to employ particularly simple manufacturing processes to produce this second protective layer.

Advantageously, the first protective layer may have a first albedo of a value substantially lower than 20%, and in particular of 15%, while the second protective layer may have a second albedo higher than 50%, and in particular of 60%. As a variant, the light-emitting device may comprise a protective outer lens arranged plumb with the light-emitting screen and provided, on one of its faces, with an anti-reflection coating. Where appropriate, the first protective layer may have a first albedo of a value substantially lower than 15%, and in particular of 10%, while the second protective layer may have a second albedo higher than 20%, and in particular of 30%. Specifically, use of such a protective outer lens allows the contrast between the first layer and the second layer to be increased or an identical contrast between these two layers to be preserved, with a view to making it possible to decrease the difference in albedo, this allowing, inter alia, the cost of producing the light-emitting device to be decreased.

In one embodiment of the invention, each of the light sources comprises at least one light emitting semiconductor chip with dimensions comprised between 150 μm and 400 μm. Such a chip is in particular known as a mini-LED. Where appropriate, the light sources may be arranged on the substrate so as to be spaced apart from one another by a distance smaller than 1 millimeter. In a variant, each of the light sources comprises at least one light emitting semiconductor chip with dimensions comprised between 5 μm and 150 μm. Such a chip is in particular known as a micro-LED. Where appropriate, the light sources may be arranged on the substrate so as to be spaced apart from one another by a distance comprised between 200 and 400 μm, or even smaller than or equal to 300 μm. The expression "distance between two light sources" is here understood to mean the distance separating the center of one of these light sources from the center of the other of these light sources. Advantageously, each of the protective layers is placed on that face of the substrate on which the light sources are arranged, and extends into the spaces separating the light sources.

Advantageously, the substrate is a printed circuit board. As a variant, the substrate may be a ceramic plate on which said interconnecting tracks are formed. The expression "ceramic plate" is understood to mean a plate made from a material of crystalline or partially crystalline or amorphous structure, such as a glass or an alumina, the body of which is formed of essentially inorganic and non-metallic substances, and which is formed by a molten mass that solidifies as it cools, or which is formed and brought to maturity, at the same time or subsequently, through the action of heat and/or pressure. Advantageously, the ceramic plate is a glass plate. Advantageously, the ceramic plate is a plate made of alumina ($Al_2O_3$) or indeed of aluminum nitride (AlN). It will be noted that a glass plate (based on borosilicate glass) is more commonly used due to its dielectric properties and production cost. If so desired, the light-emitting screen may comprise a second glass plate encapsulating the light sources on the first glass plate.

Advantageously, the first and second protective layers each comprise a solder mask, deposited on the substrate level with the interconnecting tracks. For example, each solder mask may be a dry film solder mask (DFSM). Where appropriate, said solder masks may be produced by simultaneously applying, to the substrate, two separate films using a vacuum lamination process, then exposing the assembly produced to a source of ultraviolet light, then developing the solder masks. As a variant, each solder mask may be a liquid photo-imageable solder mask (LPSM). Where appropriate, each solder mask will be produced in succession by screen printing or by spraying the liquid film onto the substrate, then by applying a photolithography mask, exposing the assembly produced to an ultraviolet source and then developing the solder mask. Preferably, the solder masks define openings in which the light sources and, where appropriate, connecting elements, such as connection terminals, of the substrate lie.

According to one example of embodiment of the invention, the first and second protective layers each consist of one of said solder masks deposited on the substrate level with the interconnecting tracks. Where appropriate, the solder mask having the second albedo is made of a material the color of which is darker than the color of the material from which the solder mask having the first albedo is made. For example, the solder mask of the second protective layer may be made of a material of green color or of red color, while the solder mask of the first protective layer may be made of a material of black color. In particular, the color green allows production methods that make it possible to obtain a high resolution to be used to produce said logo, while the color red allows a high contrast to be obtained in order to distinguish the logo from the rest of the substrate.

According to another example of embodiment of the invention, the first protective layer comprises a silicone coating. For example, this coating may be produced by spraying silicone onto the substrate, or alternatively onto a solder mask deposited on the substrate. Where appropriate, the first protective layer may comprise a solder mask made of a material of light color on which the silicone coating is deposited, the silicone being of dark color, the second protective layer comprising a solder mask made of a material of light color, and in particular of the same material as the solder mask of the first protective layer, the second protective layer being devoid of silicone coating. As a variant, the first protective layer may comprise a silicone coating of dark color deposited directly on the substrate.

According to yet another example of embodiment of the invention, the second protective layer may comprise an overprint produced on a solder mask or a silicone coating deposited on the substrate. For example, the first protective layer may comprise a solder mask made of a material of dark color and the second protective layer may comprise a solder mask made of a material of dark color, and in particular of the same material as the solder mask of the first protective layer, the logo being formed by an overprint of light color, in particular by an overprint of light color printed by ink-jet printing, on the solder mask of the second protective layer.

In one embodiment of the invention, the light-emitting screen comprises a connector able to receive a control instruction for said light sources, said instruction in particular being sent by a central computer of the motor vehicle, and a control unit arranged to selectively control each of the light sources depending on said control instruction received by the connector. Where appropriate, when the control unit receives a control instruction instructing one portion of said light sources to display on said light-emitting screen an image at least one segment of which is superposed with said logo, the control unit may be arranged to control the rest of the light sources, and in particular the light sources located beyond the logo and the image, to a strictly positive intensity setpoint. Specifically, it has been observed that the logo formed by the second protective layer remains visible, to the eyes of an external observer, when an image is displayed on the light-emitting screen superposed with the logo, this potentially causing this observer discomfort and adversely affecting her or his comprehension of this image. It will be understood that, by virtue of this feature, the brightness of the light-emitting screen is increased, in the background of the image, so as to erase the logo.

Advantageously, the control unit is arranged to control said portion of said light sources to a predetermined intensity setpoint so as to display said image on the light-emitting screen. By way of example, it could be a question of an instruction to display a pictogram informing an external observer that a door of the motor vehicle has been opened, of a pictogram informing a motorist following the motor vehicle of the presence of black ice on the road, or even of traffic-related information.

Advantageously, when the control unit receives a control instruction instructing one portion of said light sources to display on said light-emitting screen an image that is at least partially superposed with said logo, the control unit may be arranged to control the light sources that are intended to form the segment of the image that is superposed with the logo to an intensity setpoint lower than the setpoint of the light sources intended to form the rest of the image. Similarly to above, it has been observed that the portion of the logo that is superposed with said image may appear brighter to the observer. By virtue of these features, this brightness is also decreased.

According to one example, when the control unit receives a control instruction instructing one portion of said light sources to display on said light-emitting screen an image at least one segment of which is superposed with said logo, the control unit may be arranged to control the rest of the light sources to a predetermined intensity setpoint, substantially lower than the predetermined intensity setpoint of said portion of said light sources intended to produce the image.

As a variant, the light-emitting device may comprise a sensor able to measure the illumination received by the light-emitting screen. Where appropriate, when the control unit receives a control instruction instructing one portion of said light sources to display on said light-emitting screen an image at least one segment of which is superposed with said logo, the control unit may be arranged to control the rest of the light sources to an intensity setpoint defined depending on the illumination measured by said sensor. In this way, it is possible to estimate the amount of light reflected by the second protective layer, and to set, very precisely, the intensity setpoint that allows compensation to be made for this reflected light.

For example, said sensor may be a photodiode or a photoelectric cell arranged on the light-emitting screen. As a variant, said sensor may be a light source of the light-emitting screen.

In one embodiment of the invention, each light source may be mounted on the substrate by means of a thin-film transistor, on which said light source is mounted and to which it is connected. Each thin-film transistor is electrically connected to one interconnecting track. These thin-film transistors thus form an active matrix array allowing each of the light sources to be addressed and controlled, all of the light sources together thus forming an active matrix screen. Non-limitingly, on receipt of a control instruction, the control unit may be arranged to scan the matrix array of transistors vertically, by applying a selection voltage to each of the rows in succession, and, for each row selected during the scan, to simultaneously apply, depending on the control instruction, an activation or deactivation signal to each column of the matrix array, so as to cause or prevent emission of light by the light source associated with the transistor addressed by the selected row and this column. As the matrix array is active, each transistor keeps the light source associated therewith in an on or off state while the remaining rows are scanned.

As a variant, the light-emitting screen comprises a plurality of drivers for controlling the electrical power delivered to the light sources, each driver being mounted on the substrate plumb with one light source to control the electrical power delivered to the light source, in particular depending on an instruction received from the control unit associated therewith. The plurality of light sources thus forms a passive matrix-array screen.

The present invention will now be described using examples, which merely illustrate and in no way limit the scope of the invention, and the appended drawings, in which drawings the various figures show:

In the following description, elements that are identical in structure or in function and that appear in various figures keep the same references, unless otherwise stated.

Figure 1:
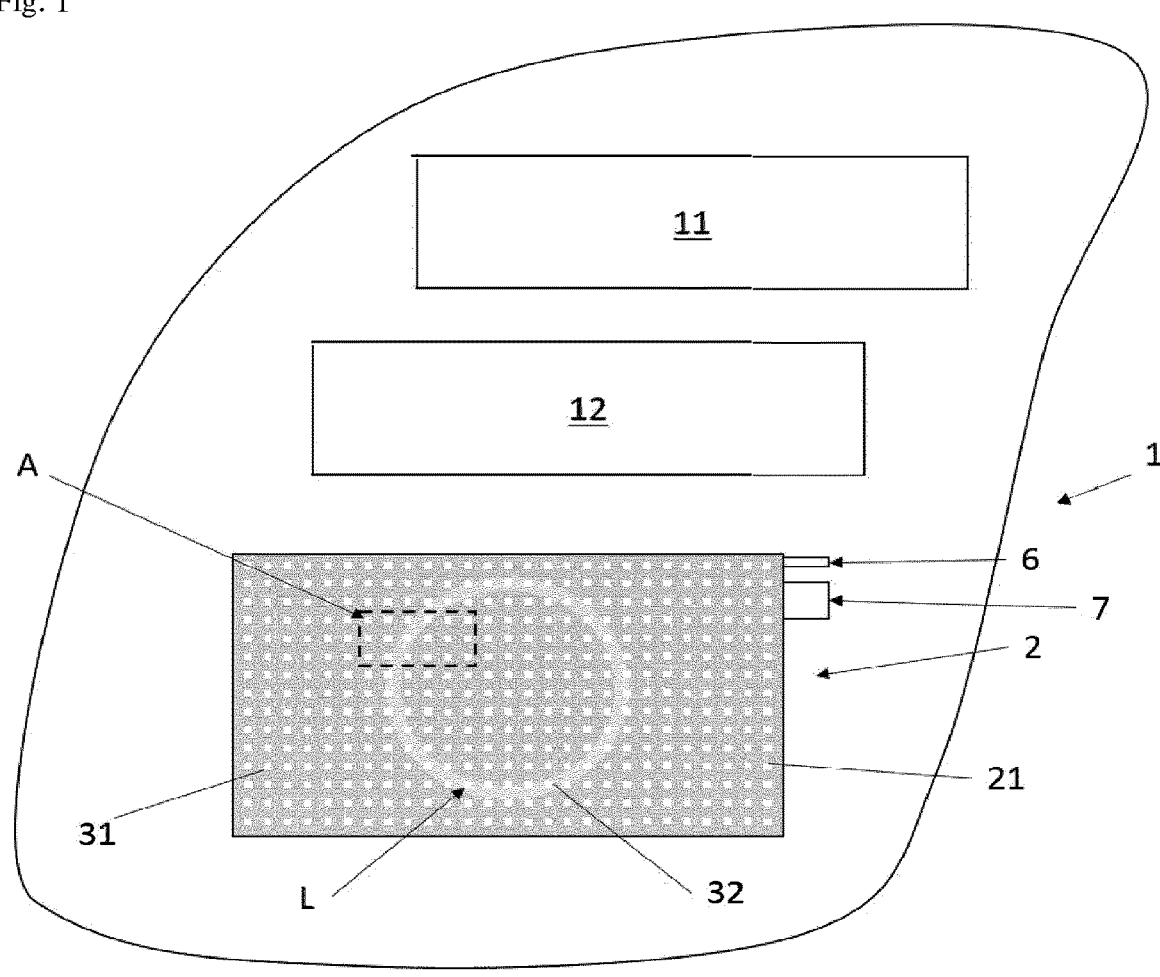
FIG. 1 shows, schematically and partially, a light-emitting device of a motor vehicle according to one embodiment of the invention.

FIG. 1 shows a light-emitting device 1 of a motor vehicle, taking the form of a rear motor-vehicle light.

Figure 2:
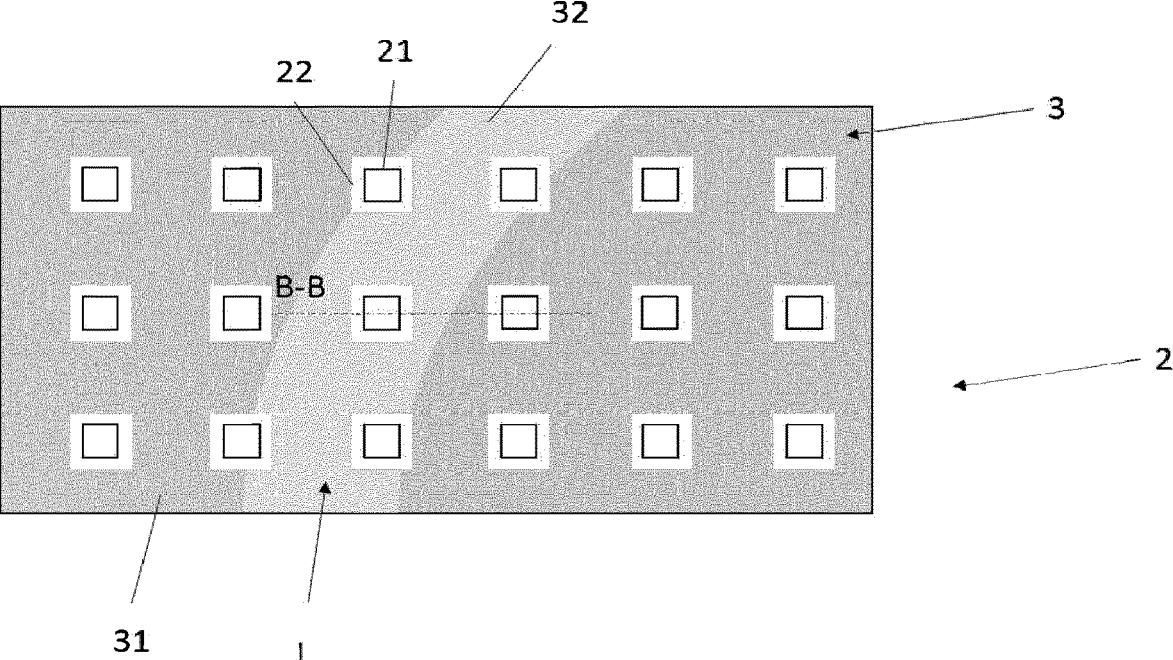
FIG. 2 shows, schematically and partially, a screen of the light-emitting device of [FIG. 1]

The light-emitting device 1 comprises a plurality of light-emitting modules 11 and 12, which are for example each intended to perform all or some of one or more regulatory signaling functions, and a light-emitting screen 2. This light-emitting screen 2 will be described with reference to [FIG. 2] and [FIG. 3], which show a segment A of the light-emitting screen 2 and a cross section B-B of the light-emitting screen 2 in segment P, respectively.

The light-emitting screen 2 comprises a plurality of light sources 21 arranged in a matrix array on a substrate 3.

Each of the light sources 21 comprises at least one light-emitting semiconductor chip the dimensions of which are comprised between 5 µm and 150 µm. The light sources 21 are mounted on the substrate 3 in a matrix array such that two neighboring light sources 21 are distant from each other by at most 300 µm.

The substrate 3 comprises a plurality of interconnecting tracks 4. In the described example, the substrate 3 is a printed circuit board, and the interconnecting tracks 4 extend over the surface of the substrate 3 and into internal layers of the substrate 3.

In the described example, it will be noted that each light source 21 is mounted on the substrate 3 by means of a thin-film transistor 5, on which said light source 21 is mounted and to which it is connected. Each thin-film transistor 5 is electrically connected to one interconnecting track 4. These thin-film transistors 5 thus form an active matrix array allowing each of the light sources 21 to be addressed and controlled, all of the light sources 21 together thus forming an active matrix screen.

In order to control this active matrix array, the light-emitting screen 2 comprises a connector 6 for receiving a control instruction for the light sources 21. It may for example be a question of an instruction to display a pictogram or a message on said light-emitting screen 2, in particular one generated by a computer of the motor vehicle, for example depending on data relating to the environment of the motor vehicle. By way of example, it could be a question of an instruction to display a pictogram informing an external observer that a door of the motor vehicle has been opened, of a pictogram informing a motorist following the motor vehicle of the presence of black ice on the road, or even of traffic-related information.

The light-emitting screen 2 further comprises a control unit 7 arranged to selectively control the active matrix array depending on the control instructions received by the connector 6. Non-limitingly, on receipt of a control instruction, the control unit 7 may be arranged to scan the matrix array of transistors 5 vertically, by applying a selection voltage to each of the rows in succession, and, for each row selected during the scan, to simultaneously apply, depending on the control instruction, an activation or deactivation signal to each column of the matrix array, so as to cause or prevent emission of light by the light source 21 associated with the transistor 5 addressed by the selected row and this column. As the matrix array is active, each transistor 5 keeps the light source 21 associated therewith in an on or off state while the remaining rows are scanned.

The substrate 3 is provided with a first protection layer 31 placed on the face of the substrate 3 that receives the light sources 21, level with certain interconnecting tracks 4, between the light sources 21. The substrate 3 is provided with a second protective layer 32 placed on the face of the substrate 3 that receives the light sources 21, level with other interconnecting tracks 4, between the light sources 21. The second protective layer 32 has a higher albedo, or reflectance, than that of the first protective layer. As shown in [FIG. 1] and [FIG. 2], the second layer 32 is arranged to form, by contrast with the first layer 31, a logo L on the screen 2, namely, in the described example, a circle.

Because of the difference in albedo between the first protective layer 31 and the second protective layer 32, the light incident on the rear light 1 is reflected, diffusely, more by the second protective layer 32 than by the first protective layer 31. Therefore, reflection of ambient light (for example ambient light generated by urban lighting or a headlamp of a motor vehicle) on this second protective layer 32 allows the logo L to be seen, by contrast with the first protective layer 31. This prevents the light-emitting screen 2 from having a completely black appearance when turned off, while allowing a logo L to be displayed on the light-emitting device 1, even when the motor vehicle is turned off, without a supply of electrical power being required.

Figure 3:
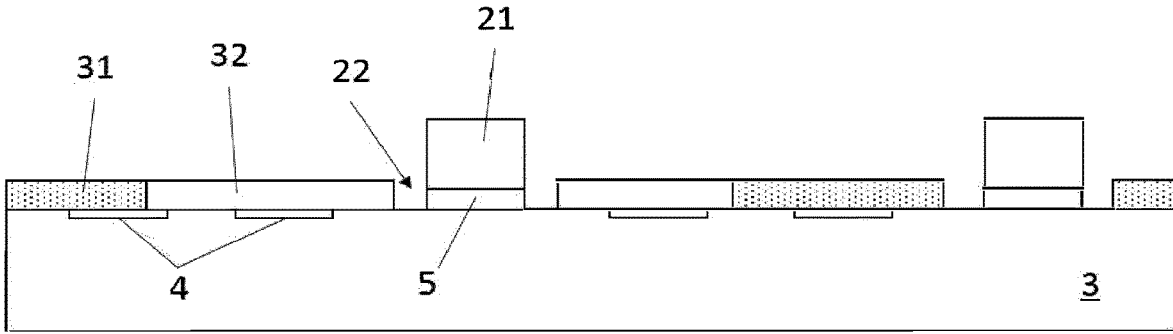
FIG. 3 shows, schematically and partially, a cross-sectional view of the screen of [FIG. 2] according to a first example of embodiment of the invention.

In this example, as shown in [FIG. 3], the first protective layer 31 is formed by a first solder mask deposited on the substrate 3, while the second layer 32 is formed by a second solder mask deposited on the substrate 32. For example, the first solder mask may be produced on the substrate prior to the assembly of the light sources 21 on the substrate 3, for example by depositing, on the bare substrate 3, using a vacuum lamination process, a film made of a material having an albedo of 15% and defining openings plumb with the zones 22 for receiving the light sources 21 and a zone for receiving the second solder mask. A film made of a material having an albedo of 60% and also defining openings plumb with the zones 22 for receiving the light sources 21 is deposited, using the same process, on the substrate 3, in the zone for receiving the second solder mask. The substrate 3 thus coated is then ex-posed to an ultraviolet source, then developed so as to obtain the first and second protective layers 31 and 32. For example, the material from which the first protective layer is obtained may be a material of dark color, in particular black, while the material from which the second protective layer is obtained may be a material of light color, in particular green or red.

Figure 4:
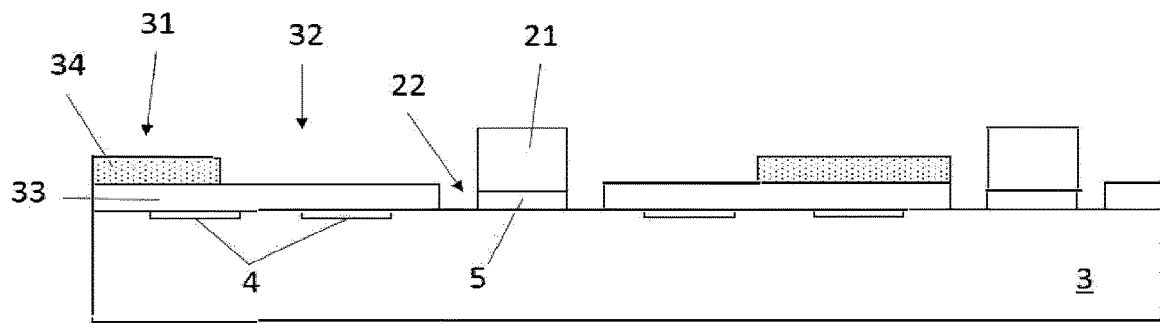
FIG. 4 shows, schematically and partially, a cross-sectional view of the screen of [FIG. 2] according to a second example of embodiment of the invention.

FIG. 4 shows another example of embodiment of a light-emitting screen according to the invention.

In this example, the substrate 3 is a glass substrate, the light sources 21 being encapsulated between this glass substrate 3 and a glass plate (not shown). The interconnecting tracks 4 were etched on the surface of the substrate 3. A solder mask 33 of light color, for example white or green, was applied uniformly to the whole of the surface of the glass substrate 3, to cover the interconnecting tracks 4 while leaving openings plumb with the zones 22 for receiving the light sources 21. After assembly of the light sources 21 on the substrate 3, a silicone coating 34 of dark color, for example black, was applied by spraying to only one portion of the solder mask 33, in order to define the first protective layer 31, the bare portion of the solder mask 33 thus defining the second protective layer 32.

Figure 5:
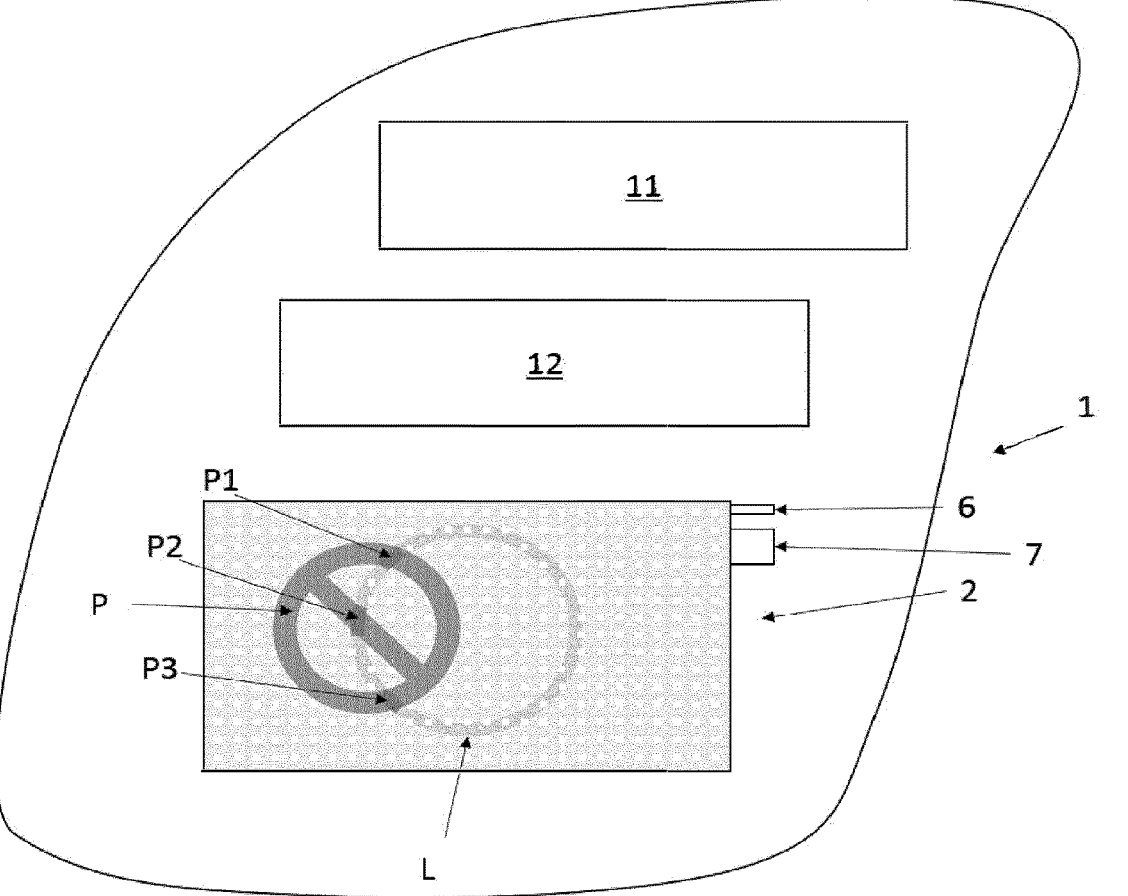
FIG. 5 shows, schematically and partially, the light-emitting device of [FIG. 1] in a first mode of control of the screen.

FIG. 5 shows the light-emitting device 1 when the control unit 7 is controlling the light sources 21 so as to display a pictogram P on the screen.

The control instruction received by the connector 6 to instruct the pictogram P to be displayed requires light sources 21 located level with the logo L to be activated. It may be seen that segments P1, P2 and P3 of the pictogram P are superposed with the logo L. It follows that ambient light reflected by these segments P1, P2 and P3 adds to the light emitted by these light sources 21 located level with the logo L, and hence these segments P1, P2 and P3 appear brighter, in contrast with the rest of the pictogram P. Likewise, the rest of the logo L also appears brighter than the, inactivated, rest of the screen 2, in contrast with the pictogram P.

Figure 6:
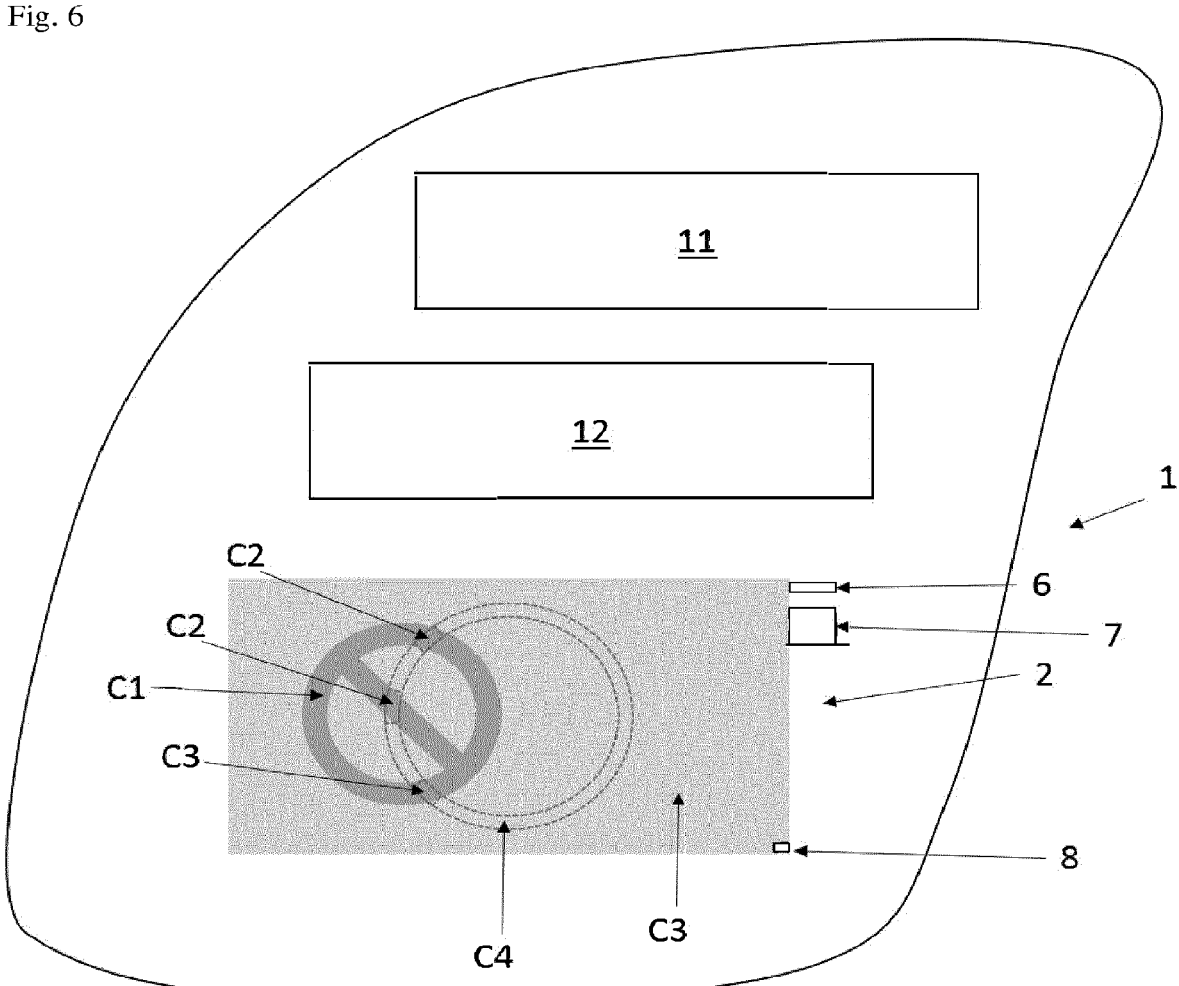
FIG. 6 shows, schematically and partially, the light-emitting device of [FIG. 1] in a second mode of control of the screen.

In order to overcome these two drawbacks, the light-emitting device 1 may incorporate a photoelectric cell 8 arranged on the light-emitting screen 2, as shown in [FIG. 6]. This photoelectric cell 8 is thus able to measure the illumination received by the light-emitting screen 2.

When a control instruction instructing the pictogram P to be displayed is received by the connector 6, the illumination received by the light-emitting screen 2 is measured by the photoelectric cell 8 and transmitted to the control unit 7. The control unit 7 then controls:

a. on the one hand, the light sources 21 intended to form the pictogram P, with the exception of segments P1, P2 and P3, to a luminance setpoint C1, which for example corresponds to a nominal luminance capable of being emitted by these light sources 21;

b. on the other hand, the light sources 21 intended to form the segments P1, P2 and P3 of the pictogram P that are superposed with the logo L, to a luminance setpoint C2 that is lower than the setpoint C1, and that is in particular determined depending on the setpoint C1 and on the measured illumination, so that the luminance of the light-emitting screen 2 level with these segments P1, P2 and P3 corresponds substantially to the setpoint C1, despite the illumination received by the light-emitting screen 2;

c. moreover, the light sources 21 situated beyond the logo L and pictogram P, to a luminance setpoint C3 that is lower than the setpoint C2, and that is in particular determined depending on the measured illumination, so that the luminance of the light-emitting screen 2, beyond the pictogram P and logo L, corresponds substantially to the luminance of the logo L (beyond the segments P1, P2 and P3), due to reflection of ambient light by the second protective layer 32;

d. lastly, the rest of the light sources 21, i.e. the light sources 21 located in the logo L but beyond the pictogram P, to a zero luminance setpoint C4.

It may thus be seen, as shown in [FIG. 6], that the pictogram P is displayed on the light-emitting screen 2 in a way that is completely uniform over its entire area, while the logo L becomes indistinguishable from the rest of the screen.

The above description clearly explains how the invention allows its set objectives to be achieved, in particular by providing a light-emitting device that incorporates a light-emitting screen comprising a plurality of light sources mounted on a substrate, the spaces of the substrate between the light sources being provided with a first or second protective layer the albedos of which are different. It will thus be understood that this difference in albedo allows, via reflection of incident ambient light, a logo to be formed on the screen, without requiring activation of the light sources, the screen having a turned-off appearance that causes this logo to appear, both night and day.

In any event, the invention is not limited to the embodiments specifically described in this document, and extends in particular to all equivalent means and to any technically workable combination of these means. In particular, a substrate made from a ceramic other than glass may be employed. Other types of light source than the type described may also be employed, and in particular light sources of larger dimensions, for example comprised between 150 μm and 400 μm. Other types of protective layers, and in particular protective layers having a smaller albedo differential than the one described, may be envisaged, in particular in combination with a protective outer lens of the light-emitting device provided with an anti-reflection coating. It is also possible to envision embodiments of these protective layers other than those described, and in particular protective layers formed from liquid photo-imageable solder mask, protective layers formed from a silicone coating deposited directly on the substrate, or even protective layers comprising an overprint produced on a solder mask or on a silicone coating. Moreover, it must be understood that the protective layers may be placed between the light sources, even when tracks connecting the light sources are not located on the surface of the substrate.

The invention claimed is:

1. A light-emitting device for a motor vehicle, comprising a light-emitting screen including a plurality of light sources arranged in a matrix array on a substrate that is provided with a plurality of interconnecting electrical tracks extending between the light sources, the substrate comprising a first protective layer placed between the light sources and having a first albedo and a second protective layer placed between the light sources and having a second albedo higher than the first albedo, the second layer defining a logo.

2. The light-emitting device as claimed in claim 1, wherein the first protective layer is placed on tracks between the light sources and the second protective layer is placed on other tracks between the light sources.

3. The light-emitting device as claimed in claim 1, wherein the light sources comprise at least one light-emitting semiconductor chip having a length or width dimension of between 150 μm and 400 μm.

4. The light-emitting device as claimed in claim 1, wherein the light sources comprise at least one light-emitting semiconductor chip having a length or width dimension of between 5 μm and 150 μm.

5. The light-emitting device as claimed in claim 1, wherein the first and second protective layers each comprise a solder mask deposited on the substrate level with the interconnecting tracks.

6. The light-emitting device as claimed in claim 5, wherein the first and second protective layers each consist of a solder mask deposited on the substrate level with the interconnecting tracks.

7. The light-emitting device as claimed in claim 1, wherein the first protective layer comprises a silicone coating.

8. The light-emitting device as claimed in claim 1, wherein the second protective layer comprises an overprint produced on a solder mask or a silicone coating deposited on the substrate.

9. The light-emitting device as claimed in claim 2, wherein the light sources comprise at least one light-emitting semiconductor chip having a length or width dimension of between 150 μm and 400 μm.

10. The light-emitting device as claimed in claim 2, wherein the light sources comprise at least one light-emitting semiconductor chip having a length or width dimension of between 5 μm and 150 μm.

11. The light-emitting device as claimed in claim 2, wherein the first and second protective layers each comprise a solder mask deposited on the substrate level with the interconnecting tracks.

12. The light-emitting device as claimed in claim 2, wherein the first protective layer comprises a silicone coating.

13. The light-emitting device as claimed in claim 2, wherein the second protective layer comprises an overprint produced on a solder mask or a silicone coating deposited on the substrate.

14. The light-emitting device as claimed in claim 2, wherein the light-emitting screen comprises a connector able to receive a control instruction for said light sources, and a control unit arranged to selectively control each of the light sources depending on said control instruction received by the connector, wherein, when the control unit receives a control instruction instructing one portion of said light sources to display on said light-emitting screen an image at least one segment of which is superposed with said logo, the control unit is arranged to control the rest of the light sources to a strictly positive intensity setpoint.

15. The light-emitting device as claimed in claim 3, wherein the first and second protective layers each comprise a solder mask deposited on the substrate level with the interconnecting tracks.

16. The light-emitting device as claimed in claim 3, wherein the first protective layer comprises a silicone coating.

17. A light-emitting device for a motor vehicle, comprising a light-emitting screen including a plurality of light sources arranged in a matrix array on a substrate that is provided with a plurality of interconnecting electrical tracks extending between the light sources, the substrate comprising a first protective layer placed between the light sources and having a first albedo and a second protective layer placed between the light sources and having a second albedo higher than the first albedo, the second layer defining a logo, wherein the light-emitting screen comprises a connector able to receive a control instruction for said light sources, and a control unit arranged to selectively control each of the light sources depending on said control instruction received by the connector, wherein, when the control unit receives a control instruction instructing one portion of said light sources to display on said light-emitting screen an image at least one segment of which is superposed with said logo, the control unit is arranged to control the rest of the light sources to a strictly positive intensity setpoint.

18. The light-emitting device as claimed in claim 17, wherein, when the control unit receives a control instruction instructing one portion of said light sources to display on said light-emitting screen an image that is at least partially superposed with said logo, the control unit is arranged to control the light sources that are intended to form the segment of the image that is superposed with the logo to an intensity setpoint lower than the setpoint of the light sources intended to form the rest of the image.

19. The light-emitting device as claimed in claim 17, wherein it comprises a sensor able to measure the illumination received by the light-emitting screen, and in that, when the control unit receives a control instruction instructing one portion of said light sources to display on said light-emitting screen an image at least one segment of which is superposed with said logo, the control unit is arranged to control the rest of the light sources to an intensity setpoint defined depending on the illumination measured by said sensor.

20. The light-emitting device as claimed in claim 18, wherein it comprises a sensor able to measure the illumination received by the light-emitting screen, and in that, when the control unit receives a control instruction instructing one portion of said light sources to display on said light-emitting screen an image at least one segment of which is superposed with said logo, the control unit is arranged to control the rest of the light sources to an intensity setpoint defined depending on the illumination measured by said sensor.

* * * * *